US011778769B2

(12) United States Patent
Sanvito et al.

(10) Patent No.: US 11,778,769 B2
(45) Date of Patent: Oct. 3, 2023

(54) HOUSING FOR AN ELECTRICAL APPARATUS

(71) Applicant: VALEO SYSTEMES DE CONTROLE MOTEUR, Cergy Pontoise (FR)

(72) Inventors: Guillaume Sanvito, Elancourt (FR); Pierre Smal, Sartrouville (FR)

(73) Assignee: VALEO SIEMENS EAUTOMOTIVE FRANCE SAS, Cergy (FR)

( * ) Notice: Subject to any disclaimer, the term of this patent is extended or adjusted under 35 U.S.C. 154(b) by 564 days.

(21) Appl. No.: 15/776,060

(22) PCT Filed: Nov. 11, 2016

(86) PCT No.: PCT/EP2016/077440
§ 371 (c)(1),
(2) Date: May 14, 2018

(87) PCT Pub. No.: WO2017/081256
PCT Pub. Date: May 18, 2017

(65) Prior Publication Data
US 2020/0253074 A1 Aug. 6, 2020

(30) Foreign Application Priority Data
Nov. 13, 2015 (FR) ..................................... 1560863

(51) Int. Cl.
*H05K 7/14* (2006.01)
*H05K 7/20* (2006.01)

(52) U.S. Cl.
CPC ....... *H05K 7/1432* (2013.01); *H05K 7/20927* (2013.01)

(58) Field of Classification Search
CPC .......................... H05K 7/1432; H05K 7/20927
See application file for complete search history.

(56) References Cited

U.S. PATENT DOCUMENTS 5,966,291 A * 10/1999 Baumel ............. H05K 7/20927
165/80.3
6,362,964 B1 * 3/2002 Dubhashi ................ H01L 23/24
257/724

(Continued)

FOREIGN PATENT DOCUMENTS

EP       1863156 A1    12/2007

OTHER PUBLICATIONS

International Search Report and Written Opinion of the Search Authority for PCT/EP2016/077440.
French Office Preliminary Search Report.

*Primary Examiner* — Anthony M Haughton
*Assistant Examiner* — Theron S Milliser
(74) *Attorney, Agent, or Firm* — Joseph G. Chu; Jeremy I. Maynard; JCIP

(57) ABSTRACT

The invention relates to a housing for an electrical apparatus, said housing including: a first chamber (117) intended for receiving first electronic components (300, 315); a second chamber (127) intended for receiving second electronic components; an interface separating the first chamber (117) from the second chamber (127); and a cooling circuit configured to receive a fluid intended for cooling said electrical apparatus, said cooling circuit being formed inside said housing interface, wherein said interface includes a blind hole extending from the first chamber (117) towards the second chamber (127), which is configured to form a cavity intended for receiving a first component (315).

8 Claims, 12 Drawing Sheets

(56) References Cited

U.S. PATENT DOCUMENTS

| | | | | |
|---|---|---|---|---|
| 6,414,867 B2* | 7/2002 | Suzuki | H02M 7/003 | 361/709 |
| 6,538,308 B1* | 3/2003 | Nakase | H01L 23/42 | 257/675 |
| 7,208,678 B2* | 4/2007 | Shinmura | H05K 7/20927 | 174/17 R |
| 7,710,721 B2* | 5/2010 | Matsuo | H01L 23/473 | 361/699 |
| 7,742,303 B2* | 6/2010 | Azuma | B60L 15/007 | 361/699 |
| 7,812,443 B2* | 10/2010 | Tokuyama | H05K 7/20927 | 257/706 |
| 7,952,876 B2* | 5/2011 | Azuma | B60L 50/61 | 361/699 |
| 7,968,925 B2* | 6/2011 | Tokuyama | H01L 25/115 | 257/299 |
| 7,978,471 B2* | 7/2011 | Tokuyama | H01L 24/45 | 361/699 |
| 8,159,823 B2* | 4/2012 | Murakami | F28F 3/12 | 361/716 |
| 8,203,839 B2* | 6/2012 | Dede | F28F 21/06 | 361/692 |
| 9,179,581 B2* | 11/2015 | Suwa | H01L 24/40 | |
| 9,241,429 B2* | 1/2016 | Kaneko | H01L 23/473 | |
| 9,729,076 B2* | 8/2017 | Nakatsu | B60L 50/16 | |
| 9,831,799 B2* | 11/2017 | Shinohara | H02M 7/537 | |
| 9,870,974 B2* | 1/2018 | Ide | H01L 25/00 | |
| 9,999,150 B2* | 6/2018 | Maeda | H05K 7/02 | |
| 10,034,401 B2* | 7/2018 | Suwa | H02M 7/537 | |
| 10,080,314 B2* | 9/2018 | You | H05K 1/18 | |
| 10,348,214 B2* | 7/2019 | Nakatsu | H02M 7/003 | |
| 10,512,181 B2* | 12/2019 | Suwa | H01L 24/36 | |
| 2001/0033477 A1* | 10/2001 | Inoue | H01L 23/49833 | 361/718 |
| 2003/0075784 A1* | 4/2003 | Nakase | H01L 23/473 | 257/675 |
| 2005/0040515 A1* | 2/2005 | Inoue | H01L 24/40 | 257/706 |
| 2006/0207780 A1* | 9/2006 | Shinmura | H05K 7/20927 | 174/50 |
| 2007/0096278 A1* | 5/2007 | Nakatsu | H01L 25/071 | 257/678 |
| 2008/0049476 A1* | 2/2008 | Azuma | B60L 50/60 | 363/131 |
| 2008/0251909 A1* | 10/2008 | Tokuyama | H01L 23/473 | 257/706 |
| 2009/0231811 A1* | 9/2009 | Tokuyama | H05K 7/20927 | 361/699 |
| 2010/0157640 A1* | 6/2010 | Azuma | B60L 50/60 | 363/132 |
| 2011/0069455 A1* | 3/2011 | Tokuyama | H05K 7/20927 | 361/702 |
| 2011/0299265 A1* | 12/2011 | Nakatsu | H05K 7/209 | 361/820 |
| 2011/0310585 A1* | 12/2011 | Suwa | H05K 7/2089 | 361/820 |
| 2013/0021749 A1* | 1/2013 | Nakajima | H02M 7/003 | 361/689 |
| 2013/0128643 A1* | 5/2013 | Shinohara | H02M 7/537 | 363/131 |
| 2014/0043765 A1* | 2/2014 | Gohara | H05K 7/20927 | 361/699 |
| 2015/0029666 A1* | 1/2015 | Kosuga | B60L 50/51 | 361/699 |
| 2015/0382501 A1* | 12/2015 | Horiuchi | H02M 7/539 | 363/131 |
| 2016/0007492 A1* | 1/2016 | Suwa | H05K 7/1432 | 361/820 |
| 2017/0040907 A1* | 2/2017 | Goto | H02M 7/44 | |
| 2018/0303001 A1* | 10/2018 | Suwa | H01L 23/49562 | |
| 2020/0068735 A1* | 2/2020 | Suwa | H05K 7/2089 | |
| 2020/0253074 A1* | 8/2020 | Sanvito | H05K 7/1432 | |

\* cited by examiner

HOUSING FOR AN ELECTRICAL APPARATUS

TECHNICAL FIELD

The present invention relates to a housing for an electrical apparatus, and to an electrical apparatus that comprises a housing according to the invention, in particular for applications in the automotive industry.

BACKGROUND

Well-known is an inverter to control an electrical machine on-board a vehicle. The machine on board the vehicle can drive the wheels of the vehicle. This inverter can comprise a power electronic unit that comprises components through which the electricity that powers the electrical machine passes; and a control electronic unit that comprises the components used to control the components of the power electronic unit.

Also well-known are direct/direct voltage (DC/DC) converters installed on-board a vehicle and used to convert the voltage between a first electrical system and a second electrical system of the vehicle. Typically, the first electrical system is a low voltage system that delivers a voltage of less than 60V, and specifically of 18 or 12V approximately, and the second electrical system is a high voltage system that delivers a voltage of above 60V, and in particular greater than 100, 200 or even 400V. In order to gain in integration density within the vehicle, the DC/DC converter and the inverter can be integrated in the same electrical equipment inside the vehicle.

Due to their environment, the inverter and the DC/DC converter are subject to overheating, which also stems from the high power that circulates through them when the electrical machine works at high voltage, or when the DC/DC converter performs a high-low voltage conversion.

In order to achieve efficient cooling of the inverter and the DC/DC converter, a known method is to include a two-part housing for an electrical apparatus, in which the components of the inverter and of the DC/DC converter are distributed in the two parts, with a cooling circuit running between the two parts of the housing. For example, patent application KR20110139038 A describes a similar housing for an electrical apparatus, whereby a first housing contains the components of the inverter, and a second housing contains the components of the DC/DC converter. The wall of the first housing is in contact with the wall of the second housing, thereby defining the flow channels of a cooling fluid.

However, the manufacturing of a two-part housing is complex and raises issues relating to the sealing of the cooling circuit, or to the integration of components inside the two-part housing.

SUMMARY

The purpose of the invention is to solve, at least in part, the problems relating to the prior art, by proposing a Housing for an Electrical Apparatus, said housing comprising:
- a first chamber designed to hold the first components,
- a second chamber designed to hold the second components,
- an interface separating the first and second chambers,
- a cooling circuit configured to circulate a fluid used to cool said electrical apparatus, said cooling circuit being formed in said interface housing in which said interface comprises a non-through hole that extends from the first chamber to the second chamber, and configured to form a cavity used to house a first component.

The cavity in the interface between the first and second chambers frees some space in the first chamber. This freed space in the first component improves the component integration density in the first chamber. Furthermore, as it is housed in the interface cavity, the cooling of the first component is facilitated by means of thermal drainage by the cooling circuit through the walls of the cavity.

In one embodiment, the interface comprises a first surface on the side of the first chamber and a second surface facing the first surface, on the side of the second chamber, said hole extending from a first opening in said first surface.

Furthermore, in one embodiment, said non through-hole is formed by a protrusion extending from said second surface.

In one embodiment, the interface comprises, in its thickness, a first part that forms the cooling circuit and a second part that comprises said cavity, said parts being on the respective sides of the interface.

In one embodiment, the housing for an electrical apparatus comprises:
- a first housing that defines the first chamber;
- a second housing that defines the second chamber;
- in which the interface between the two chambers is formed by a first wall of the first housing and a second wall of the second housing, resting against one another.

In one embodiment, said first opening is in the first wall, and the second wall comprises a second opening configured to correspond to the first opening.

In one embodiment, the protrusion extends from the sides of the first opening and passes through the second opening.

In one embodiment, the protrusion extends from the sides of the second opening.

The invention also concerns an electrical apparatus that comprises:
- a housing according to the invention,
- at least two first components housed in the first chamber, one being housed in said cavity, and the other being mounted on said interface,
- at least a second component housed in the second chamber, specifically mounted on said interface.

In one embodiment, the first components have electrodes that comprise parts that are largely at the same level in relation to the interface, the two first components being connected by means of a largely level electrical connector.

In one embodiment, the first component mounted on the interface comprises the switches of a voltage converter; and the first component housed in said cavity comprises a capacitor located in the path of the electric connection between a source of direct current and the voltage converter.

The invention is described in detail in the following description, with reference to the appended drawings. It should be noted that these drawings are provided solely for the purpose of illustrating the description and that the scope of the invention is in no way limited thereto.

DETAILED DESCRIPTION

FIGS. 1 to 7 and 15 to 18 are perspective or cross section views of an example of an electrical apparatus 1 according to the invention. The electrical apparatus 1 comprises a housing 100 that houses the components of the electrical apparatus 1. The electrical apparatus 1 also comprises an inverter designed to power an electrical machine, such as a rotating electrical machine, for instance a machine designed to drive the wheels of a vehicle. The electrical apparatus 1 comprises a DC/DC converter designed to convert the voltage between a first electrical system and a second direct electricity system of the vehicle.

Figure 8:
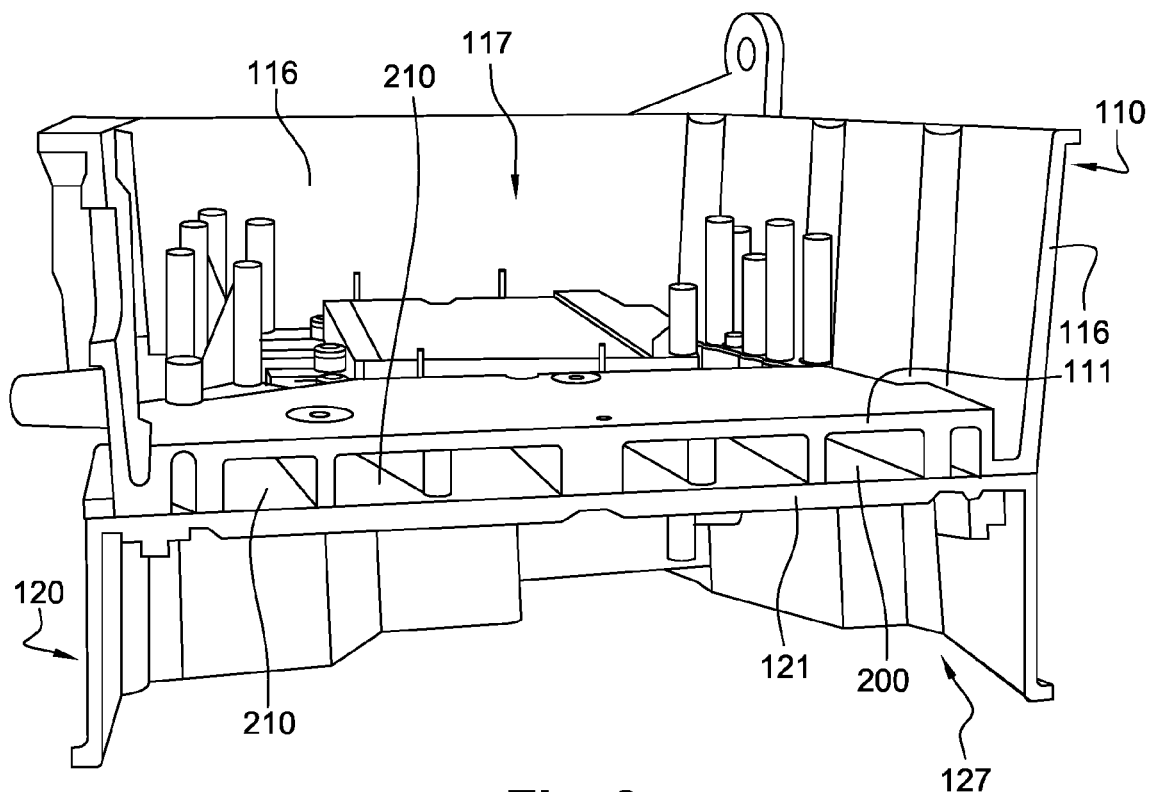
FIGS. 8 and 9 are cross section views of the housing for an electrical apparatus.
Figure 9:
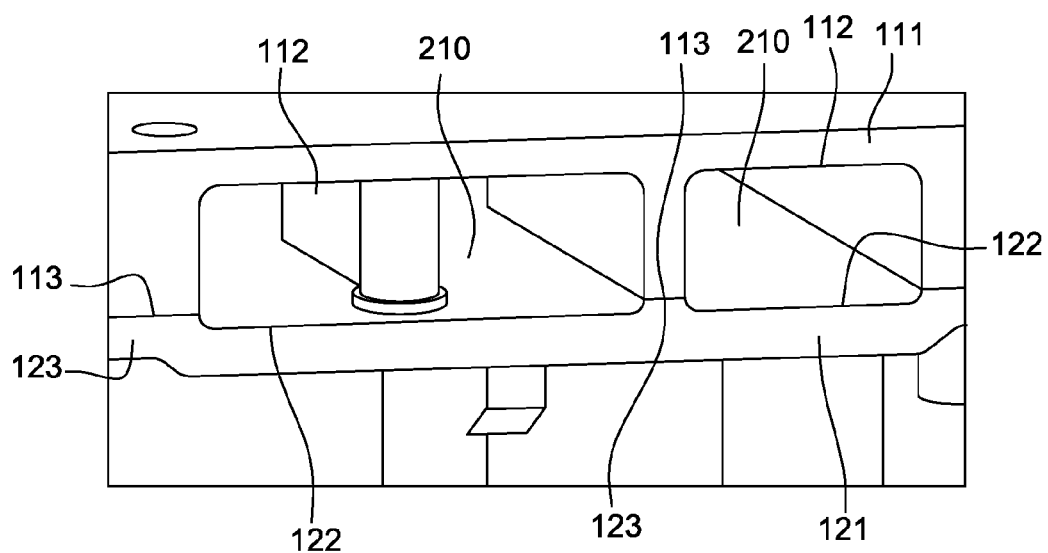
Figure 10:
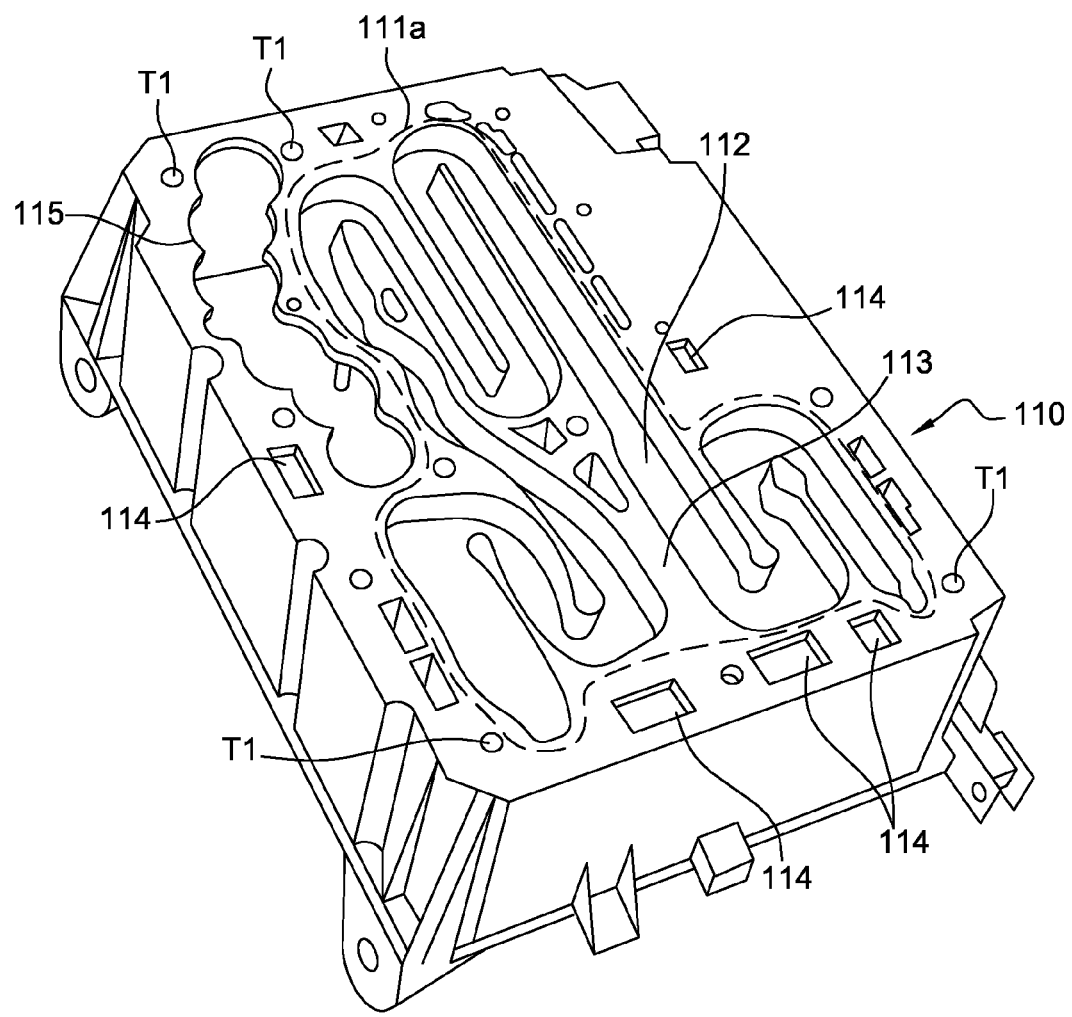
FIGS. 10 and 11 are perspective views of the first housing for an electrical apparatus.
Figure 11:
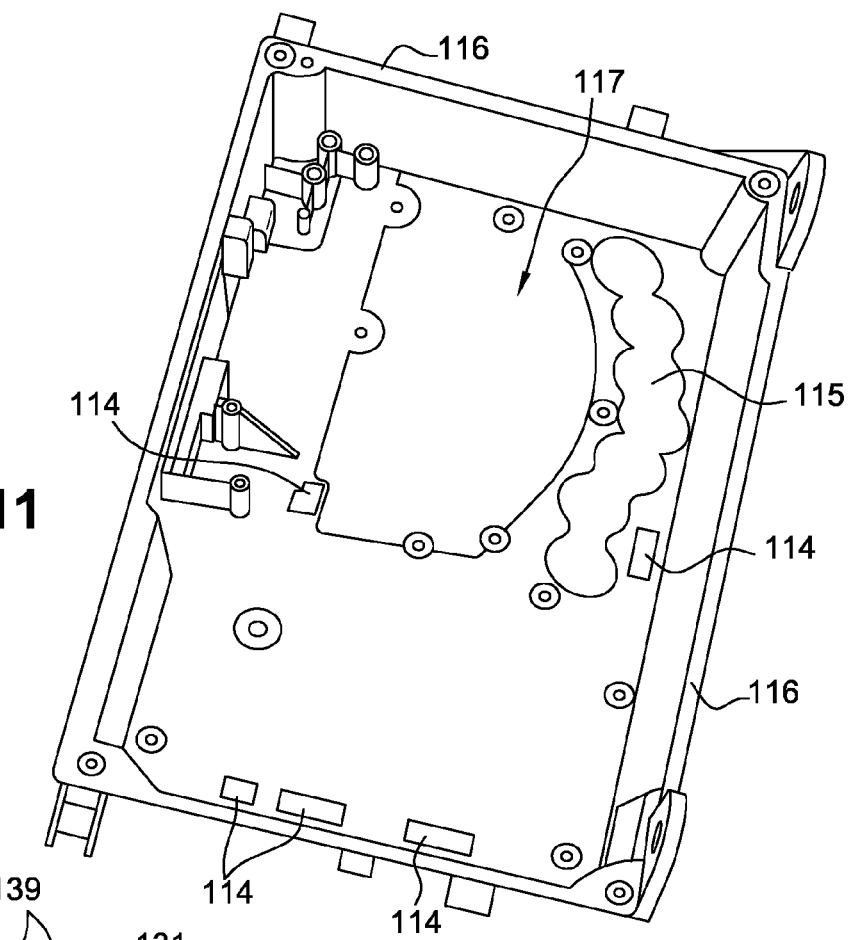
Figure 15:
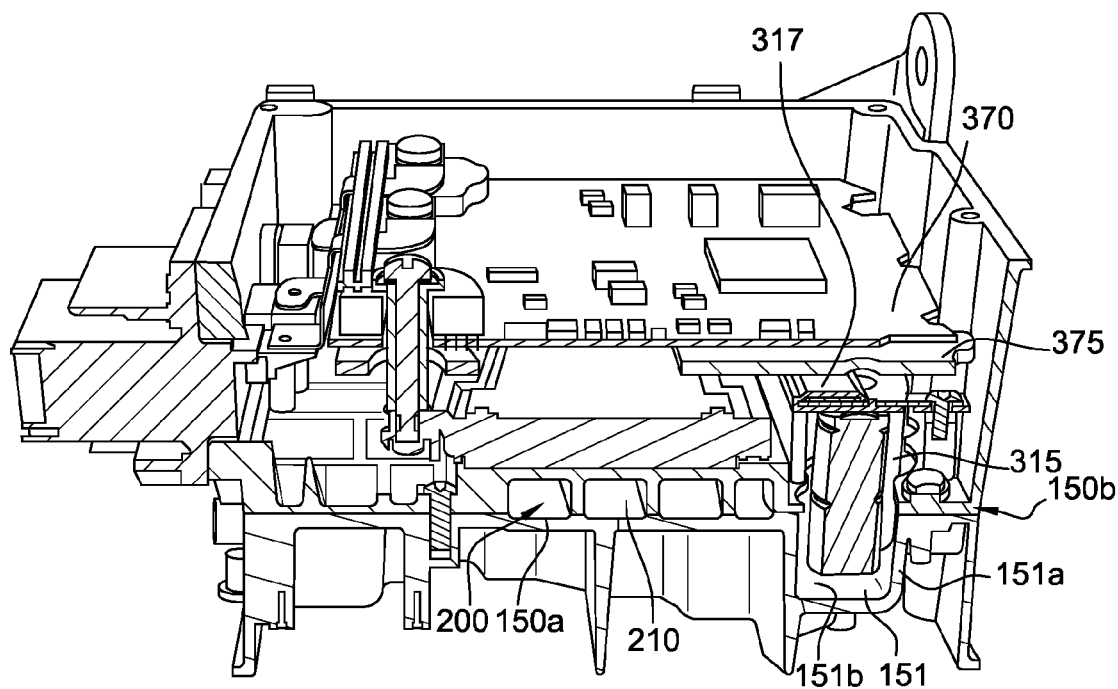
FIGS. 15 to 18 are additional cross section views of the electrical apparatus.

The housing 100 of the electrical apparatus comprises a first chamber 117 that houses the first components 300, 310, 315, 370, 375, and specifically the electronic components, and a second chamber 127 that houses the second components 320, 330, 340, 350, and specifically the electronic components. An interface 150, shown in FIGS. 5, 8 and 15, separates the first chamber 117 from the second chamber 127. The interface 150 comprises a cooling circuit 200 that cools the components of the electrical apparatus 1, by circulating a cooling fluid in the flow channels 210 of the cooling circuit 200. As shown in FIG. 15, the interface 150 comprises a non through-hole that forms a cavity 151, in which a first component 315 is housed.

The first component 315 can be secured in the cavity 151 by means of a layer of glue between the component 315 and a wall, in particular the bottom wall 151a of the cavity 151. Resin can be used to fill the space between the periphery of the component 315 and the walls 151a, 151b of the cavity 151, so as to reduce the vibrations of the first component 315 and to hold it firmly in place. Housing the first component 315 in the cavity 151 frees up space in the first chamber 117, which facilitates the integration of the other first components 300, 310, 370, 375 in the first chamber 117. Furthermore, the walls 151a, 151b of the cavity 151 improve the heat dissipation of the first components 315.

Figure 16:
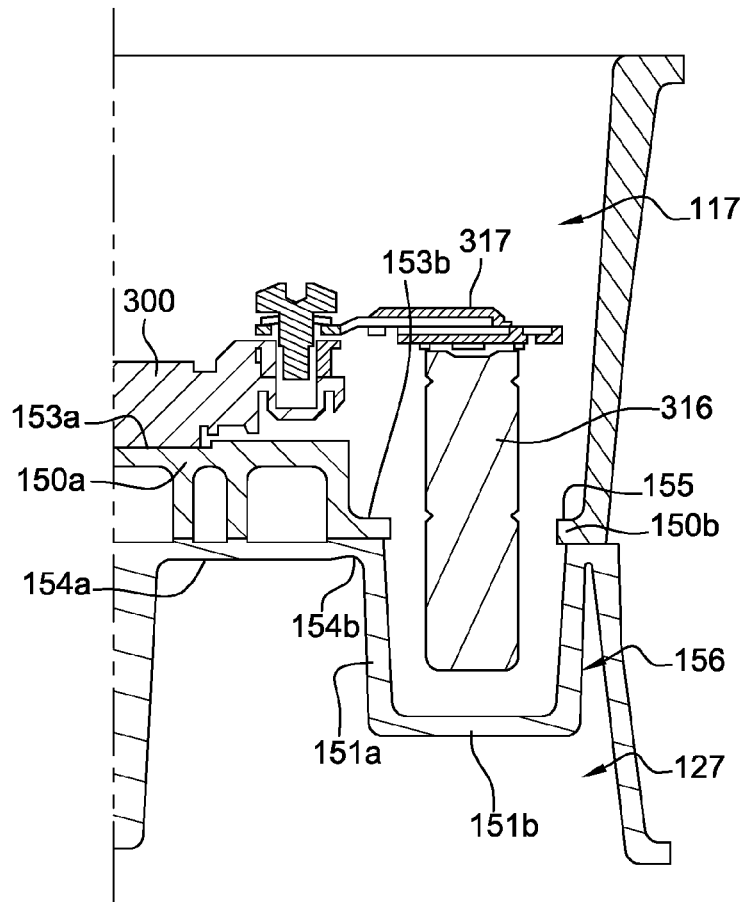

FIG. 16 is an enlarged cross section view of the electrical apparatus 1. In particular, the interface 150 comprises a first surface 153 located on the side of the first chamber 117. A second surface 154 of the interface 150 faces the first surface 153 and is located on the side of the second chamber 127. The through-hole forming the cavity 151 extends from a first opening 155 located in the first surface 153. Specifically, the first component 315 is inserted into the cavity 151 through the first opening 155. Therefore, the height of the portion of the component 315 that protrudes from the cavity 151 is smaller than the height of the first component 315. The space filled by the first component 315 in the first chamber 117 is therefore smaller than the space it would take if it was positioned on the first surface 153, which frees up space for the integration of other first components.

A protrusion 156 can extend from the second surface 154 so as to define a non through-hole that forms the cavity 151. The cavity 151 therefore extends partially into the second chamber 127 of the housing 100 of the electrical apparatus 1. Therefore, the depth of the cavity 151 is not limited by the thickness of the interface 150, specifically the thickness between the first surface 153 and the second surface 154. In particular, the protrusion 156 comprises a wall that extends from the second surface 154 so as to form the side wall 151a of the cavity 151. Specifically, the side wall 151a is aligned along the sides of the first opening 155. A wall connects the far end of the side wall 151a, so as to form a bottom wall 151b of the cavity 151. The bottom wall 151b is flat or curvilinear in shape.

The cooling circuit 200 can be included in a first part 150a of the interface 150. A second part 150b includes the cavity 151. The two parts 150a, 150b are on the respective sides of the interface 150. In particular, the first part 150a and the second part 150b both extend from the first surface 153 to the second surface 154, and are separated by a boundary that extends from the first surface 153 to the second surface 154. In other words, the cavity 151 is not included in the cooling circuit 200, which facilitates the design of the interface 150.

The first surface 153 and the second surface 154 must be level. In particular, the portion 153a of the first surface 153 located in the first part 150a of the interface 150 can be flat, with the exception of grooves to improve rigidity or of protrusions 157 (shown in FIG. 5) that create a fastening support, in particular for the first component(s). The portion 153b of the first surface 153 located in the second part 150b of the interface 150 can also be even. A step can separate the portion 153a of the first surface 153 located in the first part 150a from the portion 153b of the first surface 153 located in the second part 150b. This step is due to the thickness of the interface 150, which is greater in the first portion 150, in order to define the cooling circuit 200.

The second surface 154, in particular the portion 154a of the second surface 154, located in the first part 150a of the interface 150 and the portion 154b of the second surface 154 located in the second part 150b of the interface 150 can comprise characteristics that are similar to those described above. However, the second surface 154 does not necessarily comprise a step, in particular when the interface 150 is formed by two housings 110, 120 and when a first gorge 112, forming the cooling circuit 200 with a second gorge 122, is thicker than the second gorge 122, as is explained in further detail below.

The second part 150b of the interface 150 can also include passages for the positioning of the electrical connectors 360 (shown in FIG. 5) achieving an electric connection between the first and second components through the interface 150.

The cooling circuit 200 can comprise an input port 201 and an output port 202 through which the cooling fluid enters and exits the cooling circuit 200.

In one embodiment, the housing 100 of the electrical apparatus 1 comprises a first housing 110 that defines the first chamber 117 and a second housing 120 that defines the second chamber 127. The first housing 110 houses the first component(s) of the electrical apparatus 1. The second housing 120 houses the second component(s) of the electrical apparatus 1.

Examples of the first housing 110 and of the second housing 120 are shown in FIGS. 8 to 14. The first housing 110 comprises a first wall 111 that rests against a second wall 121 of the second housing 120 to form the interface 150 between the first chamber 117 and the second chamber 127. In particular, the first wall 110 and the second wall 120 form the cooling circuit 200.

The first wall 111 can include a gorge 112 that faces a second gorge 122 of the second wall 120 to form the cooling circuit 200. The first surface 153 of the interface 150 corresponds to surface of the first wall 111 that faces the surface featuring the first gorge 112; and the second surface 154 of the interface 150 corresponds to the surface of the second wall 121 that faces the surface featuring the second gorge 122.

In particular, the first gorge 112 and the second gorge 122 face one another to form a flow channel 210 of the cooling circuit in which the cooling fluid circulates. Therefore, the diameter of the cooling flow channel is distributed in both walls. This allows to use both walls to spread the constraints on the wall thickness due to the creation of the cooling circuit 200, and to evenly distribute between them both the chamber 117 defined by the first housing 110 and the chamber 127 defined by the second housing 120.

In particular, the first wall 111 or the second wall 121 can also comprise through-openings at the level of the cooling circuit 200. These openings are closed by a plate attached to the walls 111, 121, after installation of the first housing 110 and of the second housing 120, one on top of the other. This plate is made of, for example, a part of an electrical component mounted on walls 111, 121. Alternately, the cooling circuit is fully formed by the first gorge 112 and the second gorge 122. In other words, the cooling flow channels 210 are formed only by the gorges 112, 122.

More specifically, the first wall 111 and the second wall 121 are both made of single parts.

In particular, the first wall 111 and the second wall 121, come into contact with one another at the level of largely flat surfaces, respectively 113, 123, called bearing surfaces. The bearing surface 113 of the first wall 111 comprises the sides of the first gorge 112; and the bearing surface 123 of the second wall 121 comprises the sides of the second gorge 122. The term "side" of the first gorge 112 or of the second gorge 122 describes the boundary between the gorges 112, 122 and the surface from which the gorges 112, 122 are formed. The surface from which the first gorge 112 is formed specifically corresponds to the bearing surface 113 of the first wall 111; and the surface from which the second gorge 122 is formed specifically corresponds to the bearing surface 123 of the second wall 121. In particular, the sides of the first gorge 112 or of the second gorge 122 are fully integrated in their respective bearing surface 113, 123.

Flat bearing surfaces between the first wall 111 and the second wall 121 facilitate the implementation of the sealing means of the cooling circuit 200. The parts of the first wall 111 and the second wall 121 that come into contact to form the cooling circuit 200 are preferentially machined to eliminate any surface irregularities that could create spaces through which the cooling fluid could leak from the cooling circuit 200. The inclusion of the contact surfaces 113, 123 in the design facilitates the machining of the bearing surfaces 113, 123.

Furthermore, it is preferable that only the bearing surfaces 113, 123 of the walls 111, 121 are machined, and not the areas that are in contact with the cooling fluid, such as the gorges 112, 122. If the gorges 112, 122 are machined, this process might reveal porosities in the raw material of the first wall 111 or of the second wall 121. When the cooling fluid circulates, it could infiltrate into the walls 111, 121 through these porosities, and even leak through the first wall 111 or the second wall 121. The design, whereby the cooling circuit 200 is formed by the first gorge 112 in the first wall and by the second gorge 122 in the second wall 121, facilitates machining operations. In a housing according to the prior art, where the wall is flat and does not comprise a gorge, it is necessary to perform selective machining that only concerns the parts of the first wall that come into contact with the second wall, while avoiding the parts of the wall that come into contact with the cooling liquid, as they define a section of the flow channel of the cooling circuit. Machining operations are therefore conducted using a polishing head with a diameter that is smaller than or equal to the distance between two cooling fluid flow channels. For the housing of an electrical apparatus 1 shown in the figures, the machining tool must comprise a polishing head with a diameter that is greater than the distance between two cooling fluid flow channels, since the polishing head will only come into contact with the bearing surface 113. It is therefore possible to treat a greater surface with the polishing head, which reduces the machining time. This process also avoids the implementation of a complex route to be followed by the polishing head during selective machining operations.

Furthermore, the first wall 111 can be free of protrusions extending beyond the bearing surface 113, and the second wall 121 can be free of protrusions that extend beyond the bearing surface 123, at least in the areas 111a, 121a of the walls 111, 121 that form the cooling circuit 200. This facilitates the passage of a single machining tool on the face of the first wall 111 and on that of the second wall 121, which will form the cooling circuit 200. It should be noted that the area 111a of the first wall 111 and the area 121a of the second wall 121 that form the cooling circuit 200 correspond to the first portion 150a of the interface 150.

The first gorge 112 can be deeper than the second gorge 122. In particular, the depth of the first gorge 112 can range from 5 to 20 mm, but specifically equals 10 mm; the depth of the second gorge 122 ranges from 0.5 to 1 mm, and specifically equals 1 mm. This depth difference between the first gorge 112 and the second gorge 122 limits the thickness of the second wall 122 to provide more space in the second chamber 127.

The non through-hole that forms the cavity 151 is, in particular, formed when the first wall 111 comes into contact with the second wall 121. In particular, the first opening 155 of the interface 150 corresponds to a first opening 115 in the first wall 111. The second side 121 comprises a second opening 125. The sides of the first opening 115 of the first wall 111 correspond to the sides of the second opening 125 of the second wall 121, when the first wall 111 comes into contact with the second wall 121.

Figure 17:
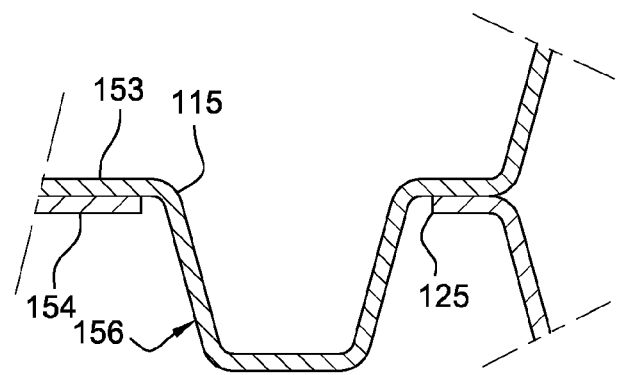
Figure 18:
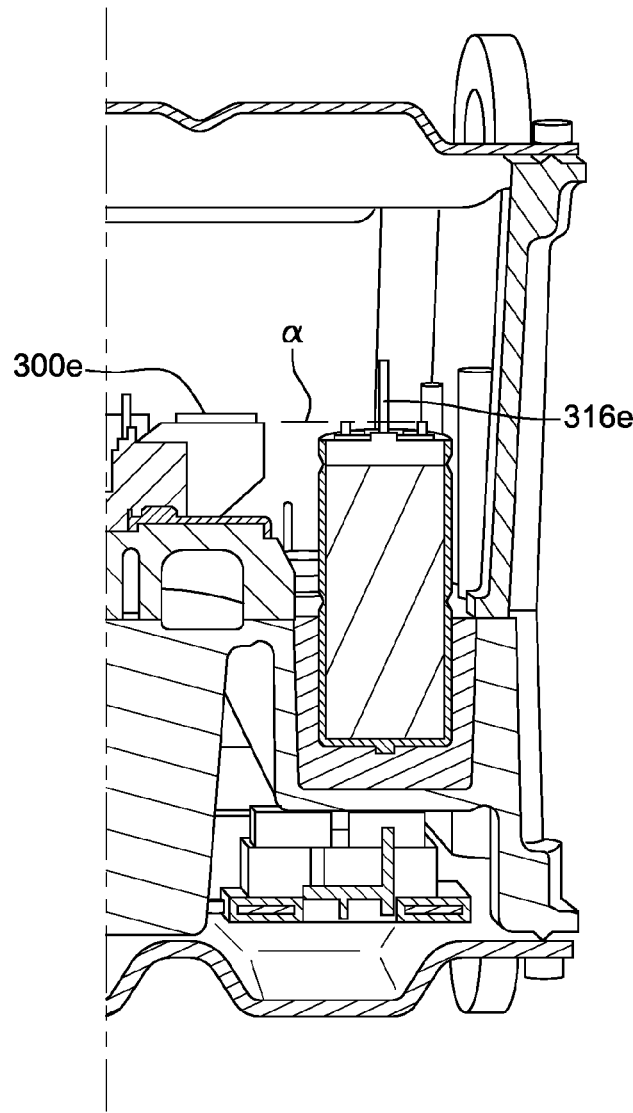

As shown in FIG. 16, the first opening 115 of the first wall 111 can be traversing and the second opening 125 of the second wall 121 can be non-traversing. The protrusion 156 that forms the cavity 151 extends from the sides of the second opening 125, from the second surface 154 of the interface 150. However, this non through-hole can be achieved in another way. For example, FIG. 17 provides a schematic example in which the first opening 115 of the first wall 111 is non-traversing and the second opening 125 of the second 121 is traversing. The protrusion 156 extends from the sides of the first opening 115 of the first wall 111. However, the example shown in FIG. 17 is less compact than that shown in FIG. 16.

The first wall 111 can comprise at least a through-hole 114 and the second wall 121 can comprise at least a through-hole 124, the sides of which come into contact with one another to form a passage between the first chamber 117 and the second chamber 127. In particular, these through-holes 114, 124 form a passage between the first surface 153 and the second surface 154 of the interface 150. These through-holes 114, 124 are in particular formed outside the areas 111a, 121a of the first wall 111 and the second wall 121 that form the cooling circuit 200. The passage formed by these through-holes 114, 124 enable the positioning of the electrical connectors 360 that achieve an electrical connection between the first and the second components through the interface 150.

Figure 12:
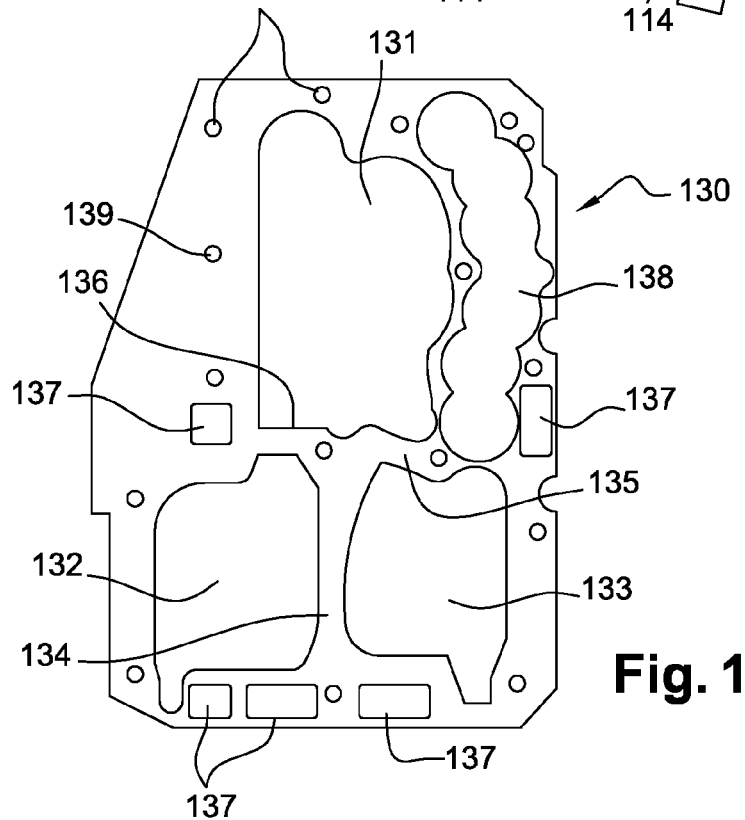
FIG. 12 shows a gasket inserted between the first and second housings of the housing for an electrical apparatus.
Figure 13:
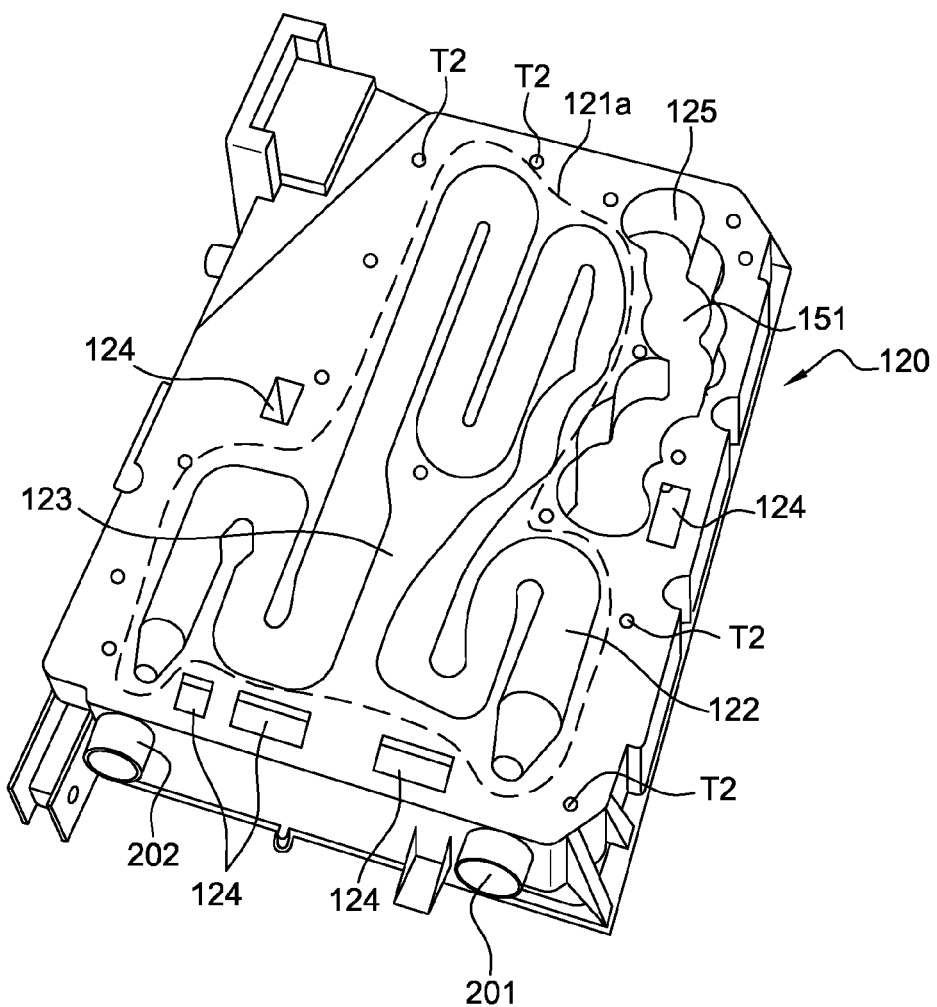
FIGS. 13 and 14 are perspective views of the second housing of the housing for an electrical apparatus.
Figure 14:
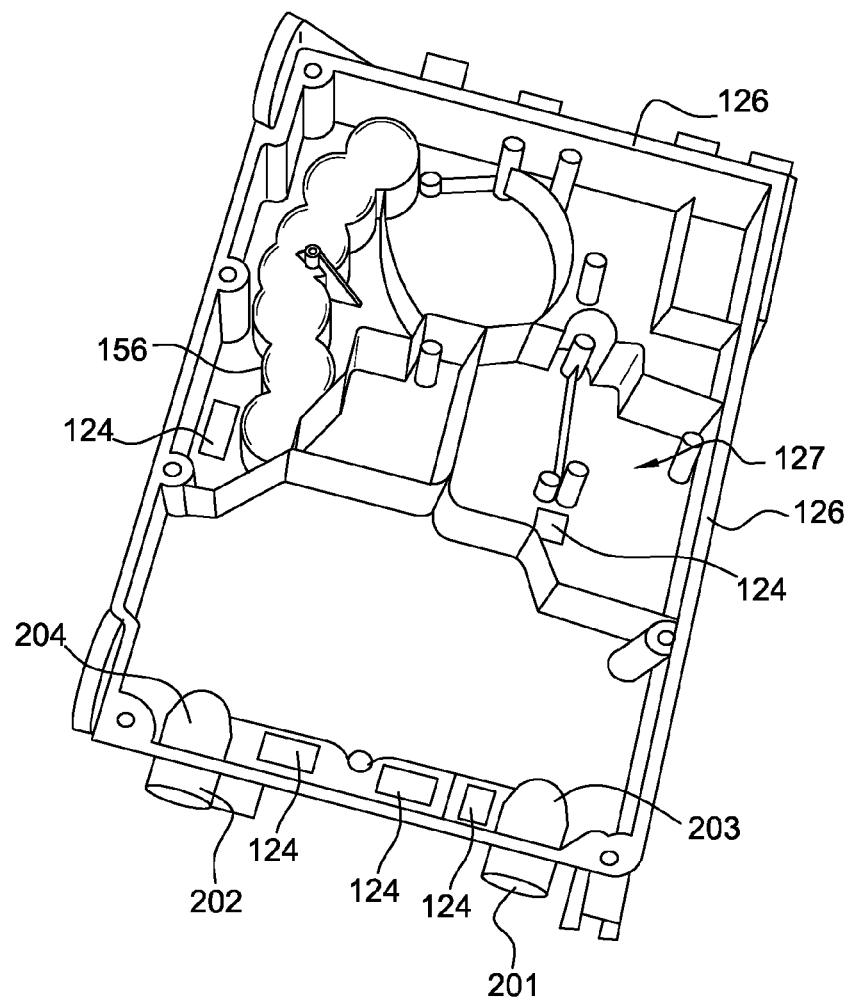

A gasket can be placed between the first wall 111 and the second wall 121. An example of a gasket 130 is shown in FIG. 12. The gasket 130 provides, in particular, the sealing around the areas 111a, 121a of the first wall 111 and the second wall 121 that form the cooling circuit 200. For this purpose, the gasket 130 is specifically placed between the bearing surfaces 113, 123 of the first wall 111 and the second wall 121. The gasket 130 can be empty in its portion that is located inside the cooling circuit 200 when it is formed, with the exception of strips of matter 134, 135, 136. These strips of matter 134, 135, 136 improve the rigidity of the gasket 130, facilitating maintenance and installation operations of the gasket 130. The strips of matter 134, 135, 136 can be just wide enough to achieve the required rigidity and define the openings 131, 132, 133. The gasket 130 provides sealing along a closed line around the cooling circuit 200, in particular around the areas 111a, 121a of the walls 111, 121 that form the cooling circuit 200, i.e. around the first portion 150a of the interface 150. The gasket 130 can also provide sealing around the passages formed in the first wall 111 and in the second wall 121. The gasket 130 therefore comprises holes 137, the sides of which provide the sealing around said passages. The gasket 130 can also comprise holes 139 that allow the passage of respective fixing devices for the fastening of the first wall 111 onto the second wall 121. A hole 138 in the gasket allows the passage of the first component 315.

In particular, the input port 201 and the output port 202 of the cooling circuit 200 are included in the second housing 120, specifically in a side wall 126 of the second housing 120 described below. In particular, the input/output ports 201, 202 are tubular openings in the side wall 116. These input/output ports 201, 202 are extended by tubes 203, 204 that communicate with the second gorge 122 of the second wall 121, to supply or evacuate the cooling fluid. The input/output ports 201, 202 could similarly have been included in the first housing 110. The inclusion of input/output ports 201, 202 in only one of the two housings 110, 120 facilitates the implementation of the sealing means at the level of the input/output ports 201, 202. Alternately, the input/output ports 201, 202 could have comprised a first part from the first housing 110 and a second part from the second housing 120, whereby both parts come into contact when the cooling circuit 200 is formed. Nozzles 205, 206 can be inserted in the input/output ports 201, 202 so that they can be adapted to a supply circuit for the cooling fluid.

Each housing 110, 120 can comprise respective side walls 116, 126 that extend transversally from the periphery of the first wall 111 or of the second wall 121 so as to define, respectively, the first chamber 117 and the second chamber 127. In particular, when the first housing 110 and the second housing 120 are mounted on top of one another so as to form the cooling circuit 200, the side walls 116 of the first housing 110 extend in the opposite direction to the second housing 120, and the side walls 126 of the second housing 120 extend in the opposite direction to the first housing 110. Each chamber, 117, 127 can be closed by a respective hood 118, 128 that comes to rest against the distal ends of said side walls 116, 126. Therefore, the first wall 111 forms the bottom of the first housing 110, and the second wall 121 forms the bottom of a second housing 120.

The first housing 110 and the second housing 120 can be fastened to one another with the fixing devices that hold the first wall 111 against the second wall 121. These fixing devices can, for example, be screws introduced in the corresponding holes T1, T2 of the first wall 111 and the second wall 121. The fixing devices can also be mounting clips, for example on the side walls 116, 126 of the first housing 110 and of the second housing 120.

In one embodiment, the first chamber 117 of the electrical apparatus 1 comprises a first component 315 housed in the cavity 151 and other components 300, 310 mounted on the interface 150. Furthermore, the second chamber 127 of the electrical apparatus 1 comprises one or several second components 320, 330, 340, 350. In particular, the second components 320, 330, 340, 350 are mounted on the interface 150.

For example, the first chamber 117 can comprise a power electronic module 300 that is part of the inverter. The power electronic module 300 comprises components used to supply the electrical machine. The first chamber 117 can comprise an "insulated moulded substrate" (SMI) printed circuit board 310 that is part of the DC/DC converter. The SMI board comprises the components for the conversion of the voltage from the first to the second electrical system of the vehicle. These power electronic modules 300 and the SMI board 310 can be supported by the first surface 153 of the interface 150, in particular the first wall 111, with one of their faces coming into contact with the first surface 153, and specifically with the first wall 111. In particular, the power electronic module 300 or the SMI board 310 can be located, at least partially, on the portion 153a of the first surface 153 located in the first part 150a (cooling part), which improves their cooling. The components of the power module 300 or of the SMI board comprise, for example, electronic switches, such as semiconductor transistors for example.

The first chamber 117 can also comprise an electronic control unit 370 and the support 375 of the electronic control unit 370. The support 375 of the electronic control unit 370 is a plate suspended in the first chamber 117. For example, the plate is held in position by resting against the portions of matter in the first housing 110, in particular the protrusions 157 from the first surface 153 of the interface 150. The plate 375 is in particular held in place by being supported around its periphery. The electronic control unit comprises a printed circuit board 370, on which the components 371 are mounted. The electronic control unit 370 is supported by support 375 by means of a contact surface with support 375. In particular, the electronic control unit 370 controls the components of the inverter and of the DC/DC converter, specifically the components of the power electronic module 300 and the SMI board 310.

The first component 315 housed in the cavity 151 can be a capacitive block 315 that comprises several capacitors 316. It is connected to the inverter, and in particular to the power electronic module 300, to the DC/DC converter and to the SMI board 310. In particular, the capacitive block 315 is involved in the electrical connection between the first electrical system of the vehicle on one hand, and the inverter and the DC/DC converter on the other, and specifically the power electronic module 300 and the SMI board 310. The capacitive block 315 constitutes the power reserve that is the closest to the power electronic module 300 and the SMI board 310, in particular for pulsing by means of the switches. For this purpose, the capacitive block 315 is connected to the power module 300 and the SMI board by means of an electrical connection bar (not shown). The inclusion of the capacitive block 315 in the cavity 151 frees up space in the first chamber 117, which facilitates the integration of the other first components 300, 310, 370 in said first chamber. In particular, it provides room to position the electronic control unit 370 and its support 375 as close as possible to the power electronic module 300 and the SMI board 310. This reduces the length of the interconnections from the electronic control unit 370 on one hand, and the power electronic module 300 and the SMI board 310 on the other hand.

For example, the capacitive block 315 can be housed in the cavity 151, so that the electrodes 316e and the capacitors 316 are at least partially at the same level α as the electrodes 300e of the power electronic module 300 and the electrodes of the SMI board 310. The level α is shown, for example, in FIG. 18. The level is best seen along a direction that is perpendicular to the first surface 153 of the interface 150, in particular from the portion 153b of the first surface 153, which is located in the second portion 150b of the interface 150. Therefore, the electrodes 316e, 300e of the capacitors can be interconnected by a flat connector 317 shown in FIG. 15. Folds in the connector 317 can thereby be avoided, which increases compactness. The inductance of the flat connector can be limited by superimposing its positive and negative electrical traces.

For example, the second chamber 127 can comprise an electromagnetic compatibility filter (or EMC) 320 to filter an incoming signal of the electrical apparatus 1, and/or an EMC filter 330 to filter the outgoing signal of the electrical apparatus 1, and/or a magnetic component 340 that comprises an inductance for the purpose of rectifying a current delivered to the power module 300 and a transformer for the DC/DC converter of the electrical apparatus 1 and/or a capacitive module 350 designed to allow zero voltage switching (or ZVS) of the electrical switches included in the electronic module 300 and/or the SMI board 310. These second components 320, 330, 340, 350 can be supported by the second surface 154 of the interface 150, in particular the second wall 121, with one of their faces coming into contact with the second surface 154 of the interface 150, and specifically with the second wall 121. Insofar as possible, the second components 320, 330, 340, 350 can be located, at least partially, on the portion 154a of the first surface 154 located in the first part 150a (cooling part), which improves their cooling.

Figure 1:
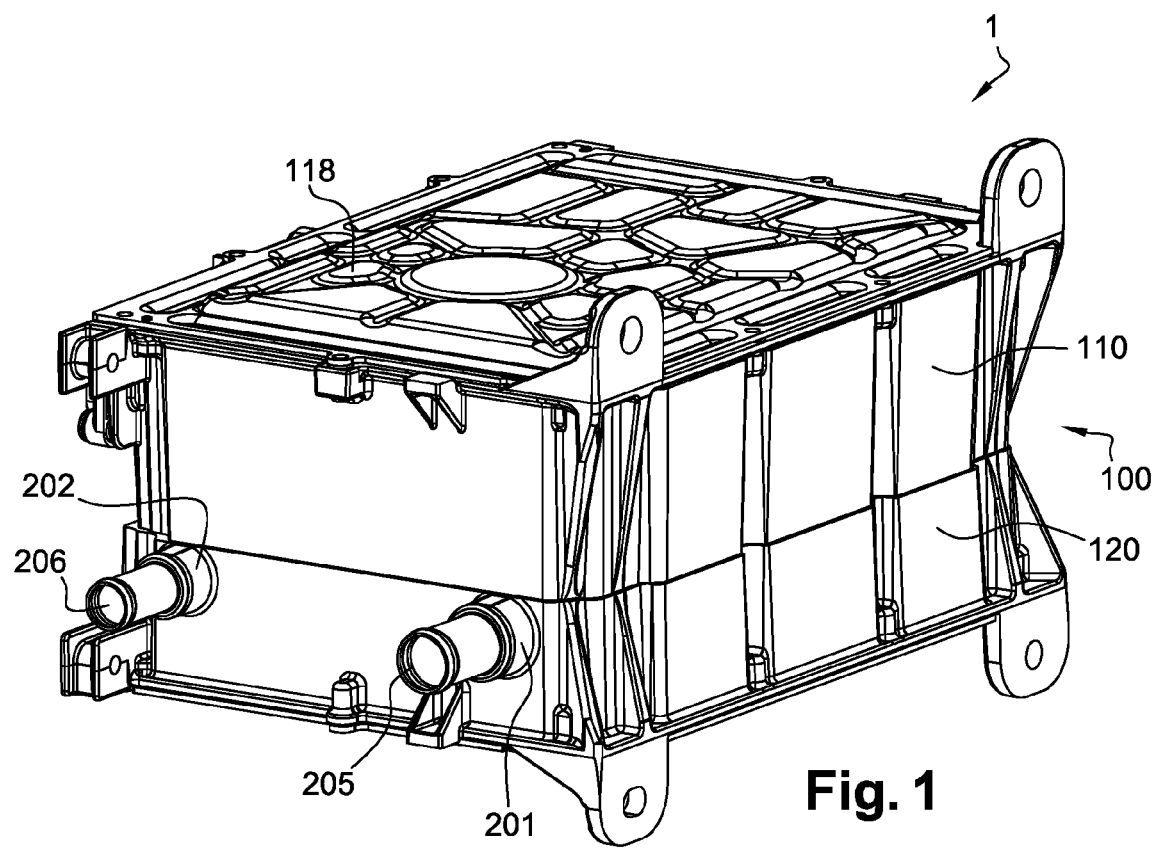
FIGS. 1 and 2 are perspective views of an example of an electrical apparatus 1 according to the invention.
Figure 2:
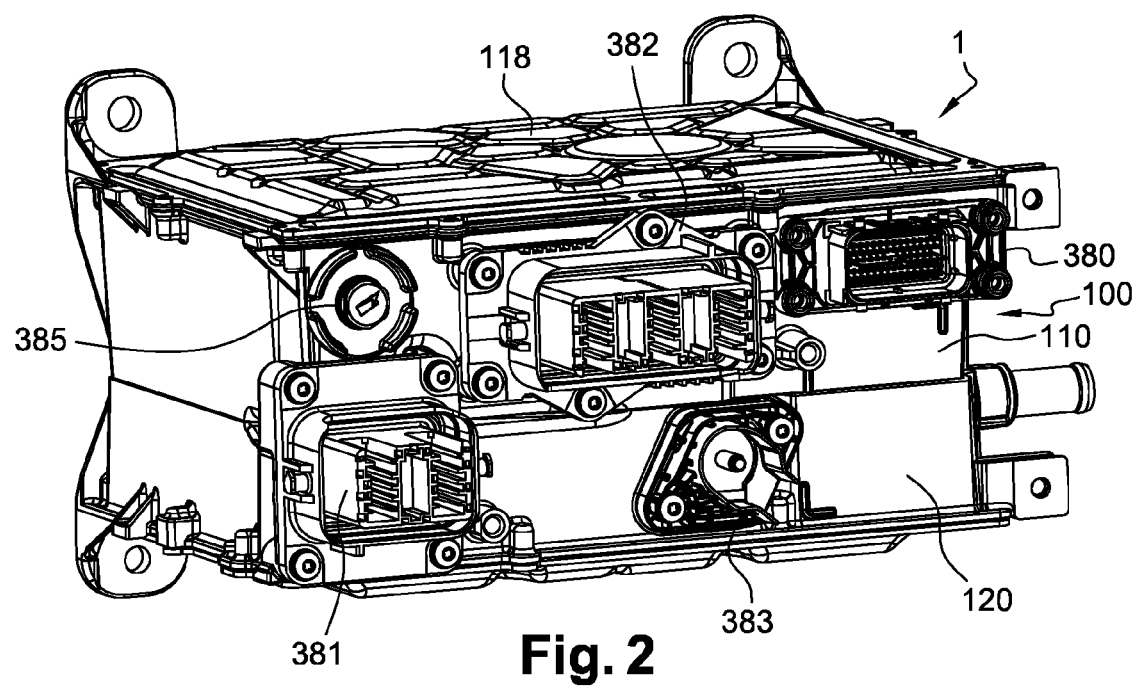
Figure 3:
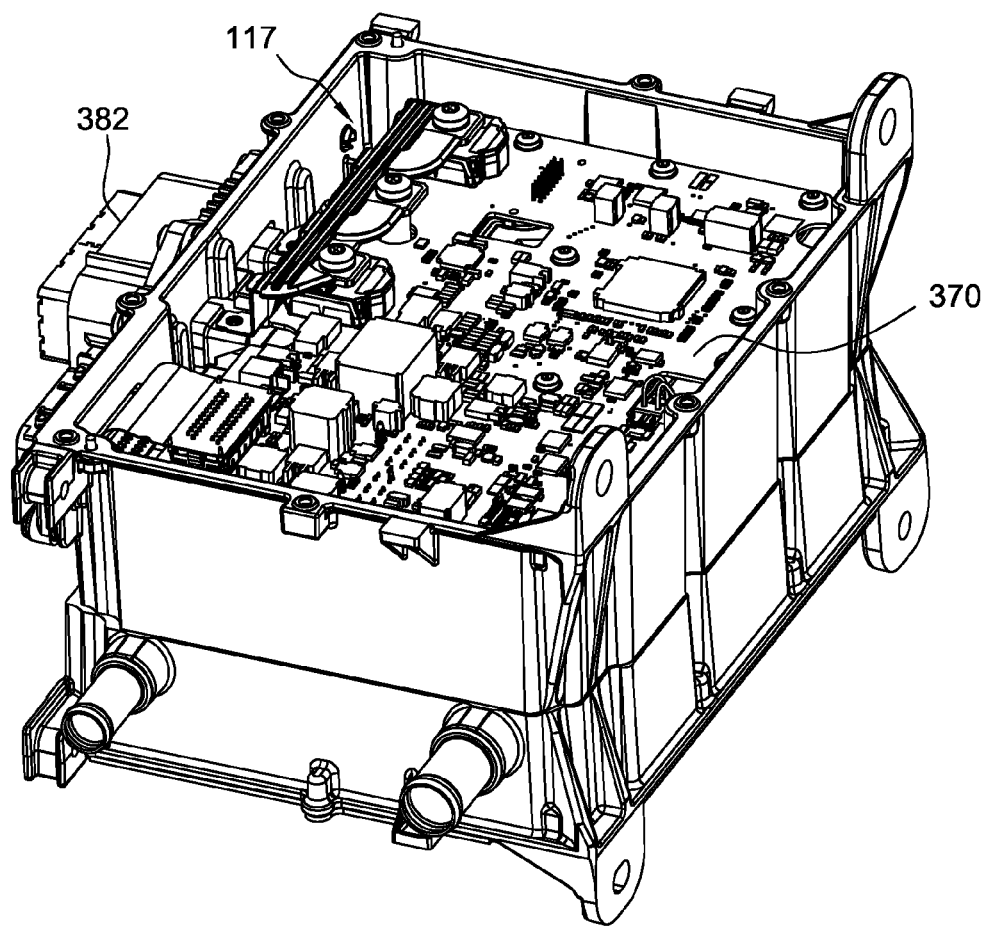
FIGS. 3 and 4 are, respectively, views of a first chamber and of a second chamber housing the electrical apparatus when the hoods are removed.
Figure 4:
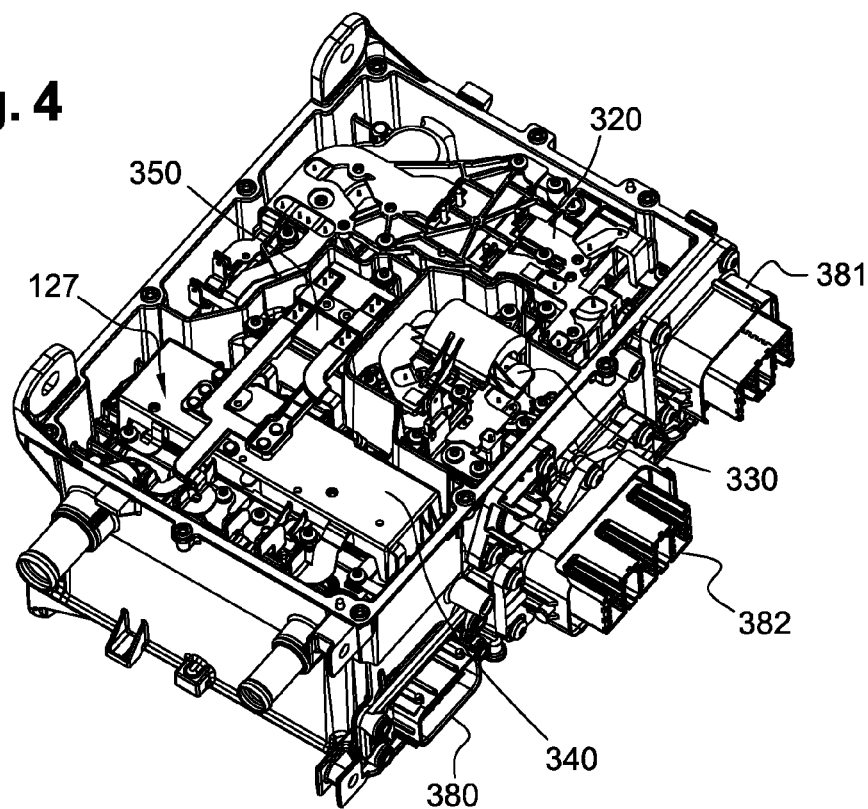
Figure 7:
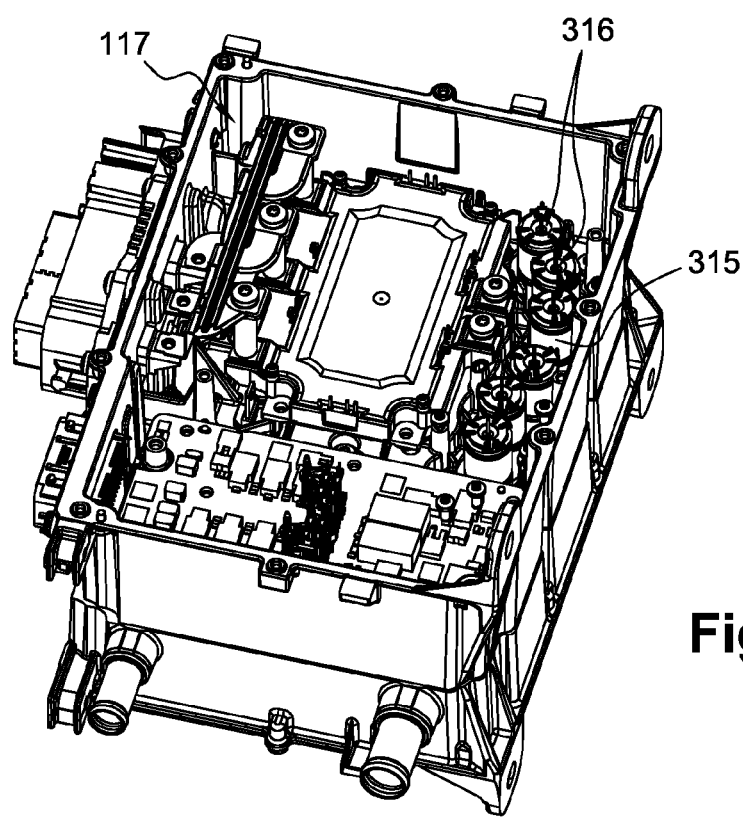
FIGS. 6 and 7 are other views of the first chamber of the electrical apparatus with some of the components removed.
Figure 5:
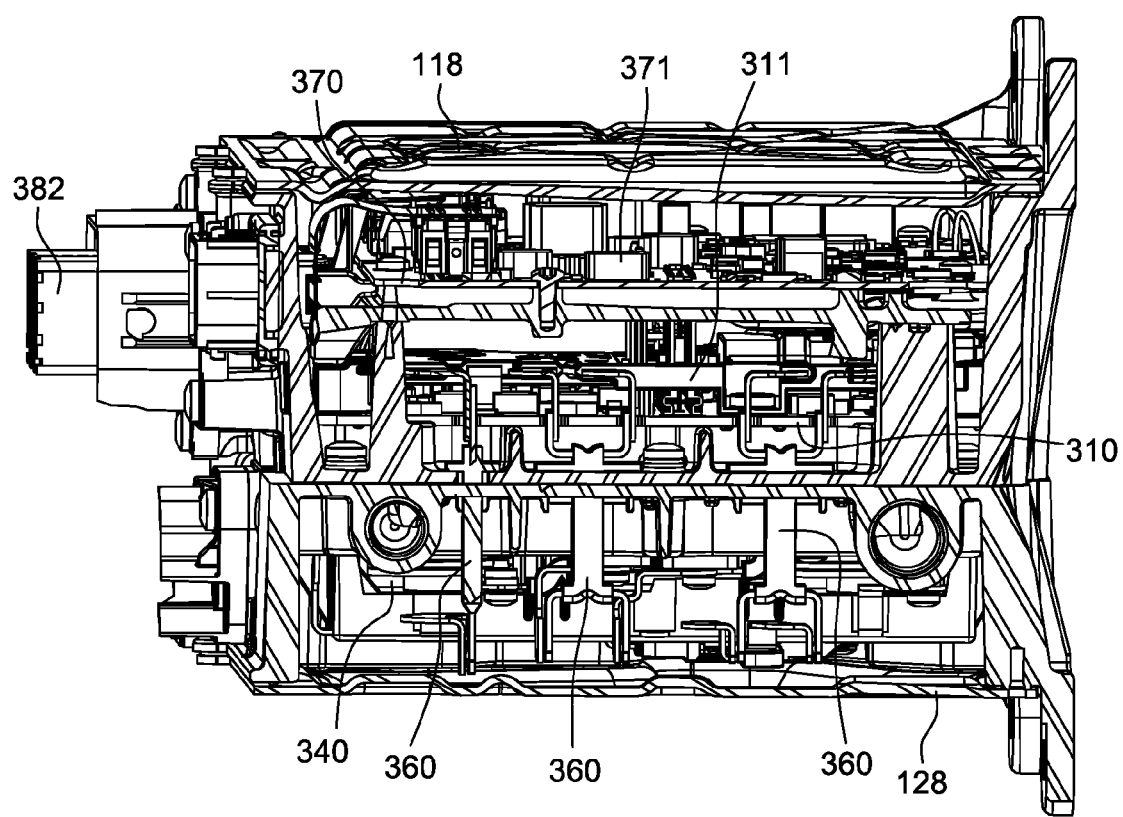
FIG. 5 is a cross section view of the electrical apparatus.
Figure 6:
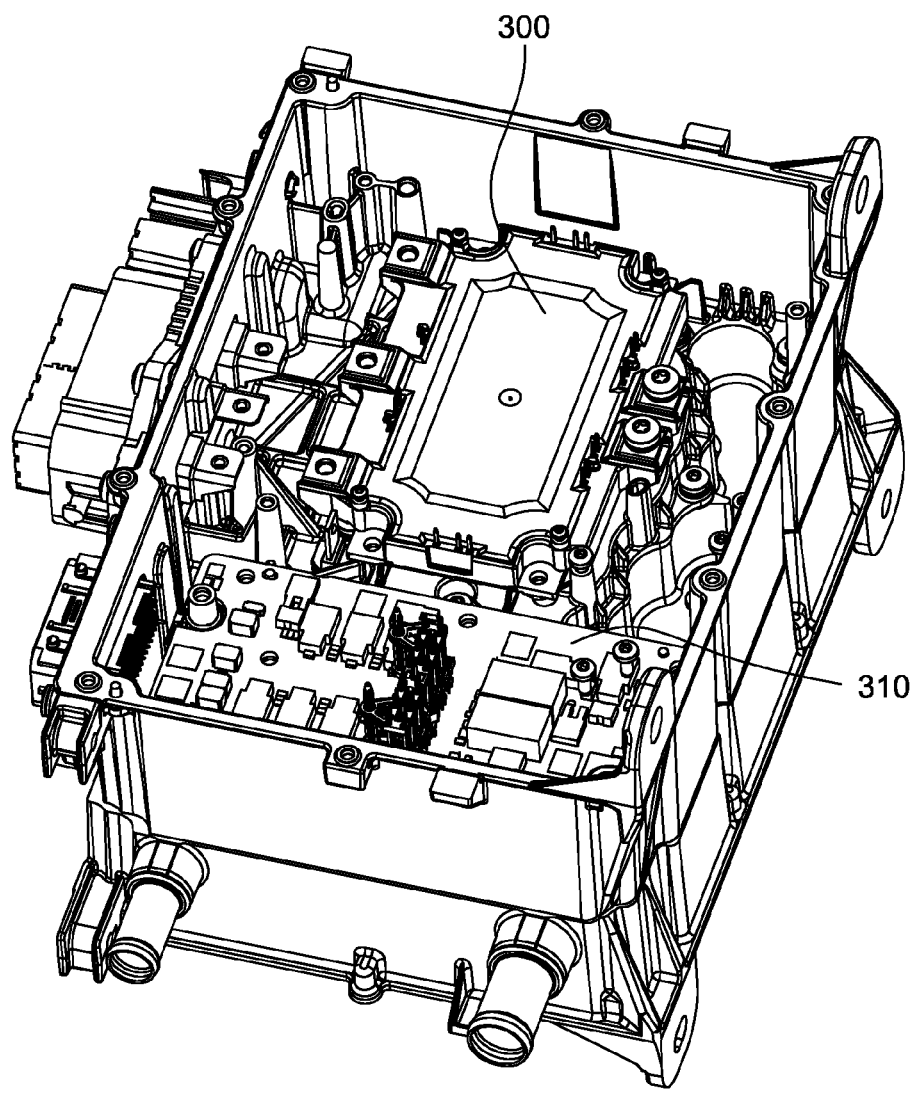

The first components 300, 310 can be electrically connected to the second components 320, 330, 340, 350 by means of electrical connectors 360 positioned in the passages defined in the interface 150. The FIG. 5 shows an example of electrical connection between an electrical connector 311 of the SMI board 310 and a terminal of the magnetic component 340, by means of an electrical connector 360.

In one embodiment, the electronic switches of the inverter and of the DC/DC converter of the electrical apparatus 1 are housed in any of the two housings 110, 120, whereas the filtering and rectifying components 320, 330, 340, 350 of the electrical apparatus 1 are housed in the other housing.

This enables to share the filtering components between the inverter and the DC/DC converter. Furthermore, by housing the switches in a single housing, it is easier to control them with a single electronic control unit 370. In particular, the electronic switches of the inverter and of the DC/DC converter of the electrical apparatus 1 are housed in the first housing 110, whereas the filtering and rectifying components 320, 330, 340, 350 of the electrical apparatus 1 are housed in the second housing 120.

The electrical apparatus 1 can comprise a signal connector 380 designed to allow a data signal exchange between the components of the electrical apparatus 1 and the outside, for example with one of the vehicle's controllers. The electrical apparatus 1 can comprise a power input connector 381 used for the electrical power supply of the components of the electrical apparatus 1. Specifically, the power input connector 381 enables an electrical connection with a first electrical system of the vehicle, in particular with an electrical storage unit of said first electrical system, for the purpose of supplying electrical power to the inverter and/or DC/DC converter of the electrical apparatus 1. A power output connector 382 enables to transfer the electrical power between the inverter of the electrical apparatus 1 and the phases of the electrical machine controlled by the inverter. A DC/DC electrical output connector 383 enables to transfer electrical power between the DC/DC converter of the electrical apparatus 1 and a second electrical system of the vehicle, in particular with an electrical storage unit of said second electrical system. The first electrical system is, for example, a high voltage system and the second electrical system is, for example, a low voltage system. The electrical connectors 380, 381, 382, 383 are, in particular, located on one side of the housing 100 of the electrical apparatus 1 shown in FIG. 2. In particular, these electrical connectors 380, 381, 382, 383 are located on the side walls 116, 126 of the first housing 110 and the second housing 120.

The electrical apparatus 1 can comprise a vent 385 used to control the humidity inside the electrical apparatus 1. The vent 385 is, specifically, located on one of the sides of the housing 100 of the electrical apparatus 1. For example, it is located on the side wall 116 of the first housing 110. It can also be located on the side wall 126 of the second housing 126.

The housing 100 of the electrical apparatus 1, in particular the first housing 111 and the second housing 121, is made of a metallic material, for example aluminium or aluminium alloy.

The invention is not limited to the example described above. The figures show a specific embodiment example that combines several embodiments. However, the comprises of each embodiment can be independent from one another in various modes, or they can be combined, as shown in the claims. In particular, the first component housed in cavity 151 can be a component other than the capacitive block 315.

The invention claimed is:

1. A housing for an electrical apparatus, the housing comprising:
   a first chamber designed to house first electrical components,
   a second chamber designed to house second electrical components,
   an interface separating the first chamber and the second chamber,
   a cooling circuit configured to circulate a fluid used to cool the electrical apparatus, the cooling circuit being formed in the interface,
   wherein:
   the interface comprises a non-through hole that extends from the first chamber to the second chamber and is configured to form a cavity used to house a first electrical component;
   the interface comprises a first surface on the side of the first chamber and a second surface opposite the first surface on the side of the second chamber, and the non-through hole extending from a first opening in the first surface, wherein the first opening is sized to receive the first electrical component, the first electrical component being inserted into the cavity through the first opening so that a height of the portion of the first component that protrudes from the cavity is smaller than a height of the first component; and the non-through hole is also formed by a protrusion that extends from the second surface toward the second chamber;

wherein the cavity is not open in/to the second chamber and the first component is a capacitive block that contains several capacitors having parts that are at a same level as the interface, the capacitors being interconnected by a flat electrical connector.

2. The housing for an electrical apparatus according to claim 1, comprising the interface that comprises in its thickness a first part that forms the cooling circuit and a second part that comprises the cavity, the first part and the second part being on the respective sides of the interface.

3. The housing for an electrical apparatus according to claim 1, comprising the housing comprising:
a first housing that defines the first chamber;
a second housing that defines the second chamber;
wherein the interface between the first housing and the second housing is formed by a first wall of the first housing and a second wall of the second housing, resting against one another.

4. The housing for an electrical apparatus according to claim 1, comprising:
a first housing that defines the first chamber;
a second housing that defines the second chamber;
the first opening is in the first wall of the first housing, the second wall of the second housing comprising a second opening configured to correspond to the first opening.

5. The housing for an electrical apparatus according to claim 1, comprising the protrusion that extends from the sides of the first opening and passes through the second opening that corresponds to the first opening.

6. The housing for an electrical apparatus according to claim 1, comprising:
a first housing that defines the first chamber;
a second housing that defines the second chamber;
wherein the first opening is in the first wall of the first housing, the second wall of the second housing comprising a second opening configured to correspond to the first opening, and the protrusion extends from the sides of the second opening.

7. An Electrical apparatus, comprising:
a housing according to claim 1,
at least two first electrical components housed in the first chamber, at least one of the two first electrical components being housed in the cavity, and the other of the at least two of the first electrical components being mounted on the interface, the first components being capacitive block that contains several capacitors having parts that are at the same level as the interface, the capacitors being interconnected by a flat electrical connector
at least a second electrical component housed in the second chamber mounted on the interface.

8. The electrical apparatus according to claim 7, comprising the first electrical component that is mounted on the interface comprises the switches of a voltage converter; and the capacitor of the first electrical component housed in the cavity is located in the path of the electric connection between a source of direct current and the voltage converter.

* * * * *